(12) United States Patent
Kolics et al.

(10) Patent No.: US 7,772,128 B2
(45) Date of Patent: Aug. 10, 2010

(54) SEMICONDUCTOR SYSTEM WITH SURFACE MODIFICATION

(75) Inventors: Artur Kolics, Dublin, CA (US); Nanhai Li, San Jose, CA (US); Marina Polyanskaya, Morgan Hill, CA (US); Mark Weise, Fremont, CA (US); Jason Corneille, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 221 days.

(21) Appl. No.: 11/760,722

(22) Filed: Jun. 8, 2007

(65) Prior Publication Data

US 2007/0287277 A1  Dec. 13, 2007

Related U.S. Application Data

(60) Provisional application No. 60/804,425, filed on Jun. 9, 2006.

(51) Int. Cl.
*H01L 21/31* (2006.01)
*H01L 21/469* (2006.01)

(52) U.S. Cl. ............... 438/763; 438/597; 438/633; 438/643; 257/E21.582; 257/E21.589

(58) Field of Classification Search .......... 438/763, 438/597, 633, 643; 257/E21.582, E21.576, 257/E21.589
See application file for complete search history.

(56) References Cited

U.S. PATENT DOCUMENTS

| 6,430,026 | B1 * | 8/2002 | Nagato et al. ............... 361/305 |
| 2003/0000083 | A1 * | 1/2003 | Takahashi ..................... 29/847 |
| 2003/0190816 | A1 * | 10/2003 | Buehler et al. ............. 438/758 |
| 2006/0128144 | A1 * | 6/2006 | Park et al. .................. 438/643 |
| 2008/0214006 | A1 * | 9/2008 | Lee et al. .................... 438/692 |

* cited by examiner

*Primary Examiner*—Alexander G Ghyka
*Assistant Examiner*—Abdulfattah Mustapha
(74) *Attorney, Agent, or Firm*—Martine Penilla & Gencarella LLP

(57) ABSTRACT

A semiconductor system includes: providing a dielectric layer; providing a conductor in the dielectric layer, the conductor exposed at the top of the dielectric layer; capping the exposed conductor; and modifying the surface of the dielectric layer, modifying the surface of the dielectric layer, wherein modifying the surface includes cleaning conductor ions from the dielectric layer by dissolving the conductor in a low pH solution, dissolving the dielectric layer under the conductor ions, mechanically enhanced cleaning, or chemisorbing a hydrophobic layer on the dielectric layer.

30 Claims, 3 Drawing Sheets

SEMICONDUCTOR SYSTEM WITH SURFACE MODIFICATION

CROSS-REFERENCE TO RELATED APPLICATION

This application claims the benefit of U.S. Provisional Patent Application Ser. No. 60/804,425 filed Jun. 9, 2006.

TECHNICAL FIELD

The present invention relates generally to semiconductor systems, and more specifically to advanced semiconductor manufacturing systems and device systems.

BACKGROUND ART

Semiconductor devices are used in products as extensive as cell phones, radios, and televisions. The semiconductor devices include integrated circuits that are connected by conductive wires embedded in insulating material.

With the reducing of semiconductor device size and the use of low dielectric constant (low k) interlayer dielectric (ILD) insulating materials, obtaining reliable semiconductor devices is becoming more and more challenging. In particular, reliability problems occur at interfaces of the copper (Cu) wires and low k ILD material in the form of leakage, electromigration, stress migration, break down voltage, and time dependent dielectric breakdown (TDDB), etc.

Cu easily diffuses into silicon (Si) and causes degradation of the dielectric material. Cu is also susceptible to oxidation and corrosion. Therefore, a capping layer of a material such as silicon nitride (SiN) or silicon carbide (SiC) is placed on the Cu surface as passivation layer to prevent Cu oxidation and Cu migration into the ILD. However, the Cu/capping layer interface is still one of the major failure paths due to the weak adhesion between Cu and the capping layer.

The dielectric layers are subjected to surface contamination in the manufacturing process (e.g., Cu chemical mechanical polishing (CMP) or electroless plating of a metallic capping layer, such as cobalt tungsten phosphorous (CoWP)). These contaminants are charged and mobile, especially under stress (high temperature and electric field). The mobility of these contaminants cause high leakage currents, and may cause damage to the dielectric materials when they move along the interface.

Low k materials (especially porous low k materials) are less dense than silicon oxide ($SiO_2$) dielectric materials, and have weaker mechanical properties; i.e., the chemical bonds are easier to break.

The damage that is induced by wet chemical or oxidative plasma clean processes are manifested in increasing dangling bond density, transformation of terminal silicon-methyl (Si—$CH_3$) bonds to more hydrophilic silicon hydroxide (Si—OH) groups. These transformations result in decreased wetting contact angle, higher moisture uptake, increased k-value, and worse leakage current.

To prevent Cu migration into the surrounding dielectric material, the Cu is encased in a barrier layer. The increase in moisture build-up can promote the oxidation of the barrier layer and Cu at the barrier/Cu interface. Such process is known to decrease TDDB lifetime.

Porous low k dielectrics are even more sensitive to moisture uptake hence there is an increased concern on their dielectric breakdown performance.

In summary, some of the factors affecting device reliability are the nature of the Cu/capping layer interfaces, surface contamination of the dielectric materials, and low k dielectric degradation caused by mechanical damage, surface modification from hydrophobic to hydrophilic, and moisture uptake.

While there have been many attempts to improve device reliability by applying metal/metal alloy capping layer on copper interconnect, solutions to the problems related to interface reliability problems have been long sought, but have long eluded those skilled in the art.

DISCLOSURE OF THE INVENTION

The present invention provides a semiconductor system including: providing a dielectric layer; providing a conductor in the dielectric layer, the conductor exposed at the top of the dielectric layer; capping the exposed conductor; and modifying the surface of the dielectric layer, wherein modifying the surface includes cleaning conductor ions from the dielectric layer by dissolving the conductor in a low pH solution, dissolving the dielectric layer under the conductor ions, mechanically enhanced cleaning, or chemisorbing a hydrophobic layer on the dielectric layer.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION

Figure 1:
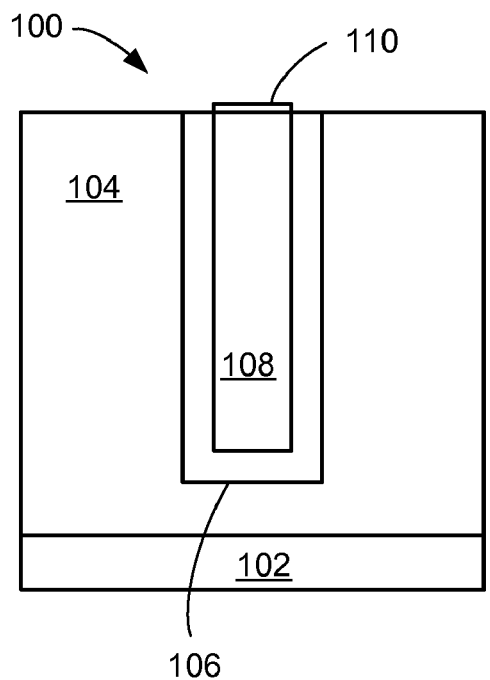
FIG. 1 is a close up view of a semiconductor interconnect after a CMP step according to a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

The term "system" as used herein means and refers to the method and to the apparatus of the present invention in accordance with the context in which the term is used.

The present invention relates to fixing dielectric induced reliability problems by minimizing or eliminating ILD contamination and surface degradation that results in higher leakage current, lower voltage breakdown and shorter time-to-dielectric breakdown.

The process flow to form a capping layer on Cu interconnects is generally made up of several steps, which may include the following:
  cleaning copper surface to establish a surface free from copper oxide and strongly bound organic compounds; the same process step also serves to remove contaminants from the dielectric surface;
  rinsing off the cleaning chemicals from the wafer surface;
  selective deposition of metal/metal alloy cap onto copper features;
  post-treatment of the metal/metal alloy cap and/or ILD to minimize deposition-induced ILD contamination and/or promote corrosion resistance of the film;
  rinsing the wafer surface with deionized water; and/or
  drying the wafer.

Embodiments of the present invention generally add process steps at a given point into the process flow described above.

1. Moisture removal by different drying methods after forming metal/metal alloy cap on Cu structures.

Spin rinse/dry technology that is used immediately after selectively depositing capping layer(s) on copper interconnects is not able to remove the moisture completely. A significant reduction of moisture can be achieved with one of the following processes:

a. thermal treatment after capping layer deposition:
  i. baking in inert ($N_2$ etc.) environment or vacuum environment or
  ii. drying with hot inert gas;
  Both of the above are performed at a temperature of about 30° C. to about 150° C.
b. critical point drying with supercritical $CO_2$, performed after metal cap layer deposition (critical point drying uses a solution that is taken from being a subcritical fluid to supercritical fluid to avoid a gas-liquid interface by keeping the densities of the gas and liquid equivalent);
c. drying with de-hydrated agent(s) such as but not limited to dehydrated alcohol, performed after metal cap layer deposition; or
d. drying with water reactive chemicals, such as, but not limited to, di-tert-butyl dicarbonate, acetic anhydride, etc. The reactions of these compounds with water are briefly described by Eqs. 1 and 2

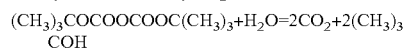

for acetic anhydride

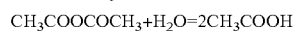

A further advantage of these starting chemicals is that their reaction products are either gaseous or volatile compounds.

This process is implemented in the final drying part of the full metal cap layer deposition process sequence. More specifically, after the metal/metal alloy cap deposition process, the wafer is generally post-cleaned by simple chemical rinse or the chemical rinse in combination with scrub then rinsed again with or without chemicals in DI, then the wafer is spin-dried to remove non-adherent water. It is after this stage when the water reactive chemical is introduced onto the wafer. After distributing the water reactive liquid on the entire wafer surface and after proper reaction time the wafer is spin-dried and the process is finished. The reaction of the water reactive liquid can be performed at room or elevated temperature to change reaction time and reaction yield.

These processes are applied as a very last step, i.e. drying, in the process flow.

2. Surface contamination removal immediately after forming metal or metal alloy cap on Cu structures:
  a. by plasma (e.g. Ar, $N_2$, $NH_3$, $H_2$ ...) clean introduced after dying step in the process flow;
  b. supercritical $CO_2$ drying as the last step in the process sequence;
  c. by removing the metal ions from the dielectric surface through:
    i. complexation (forming bonds in an exothermic process using chemicals such as hydroxyethylethylenediaminetetraacetic acid (HEDTA), cyanide, etc.) or
    ii. altering the charge of the metal compound on ILD surface as well as the surface charge of the ILD (i.e., low pH solution (pH <2) makes both the surface as well as the metal compound positively charged; the latter is achieved by decomposing the metal compound/complex by protonating the compound that is attached to the metal ion;
  d. dissolving metal if formed on the ILD in low pH solution;
  e. lift-off contaminants by dissolving ILD;
  f. combination of the above; or
  g. combination of any of the above with mechanically enhanced cleaning (e.g. scrub).

In one embodiment, the wet cleaning formulation should also contain a corrosion inhibitor and/or oxygen scavenger to minimize metal/metal alloy removal from the capping layer. In another embodiment, the wet cleaning process is performed in oxygen deprived atmosphere ($O_2 < 20\%$ vol.).

Processes c, d, and e are also included in the post-treatment phase of the capping process.

3. Surface modification by hydrophobic layer(s). Immediately prior (on ILD) to or after (ILD, metal cap, or both) the formation of metal or metal alloy cap on Cu structures. This hydrophobic layer could either selectively chemisorb on the dielectric, on the metal/metal alloy cap or cover both metallic capping layer (like CoWP, CoWB etc.) and dielectric surface.

Such hydrophobic layers can be formed using, but not limited to, silanes containing at least one apolar group which is retained on the surface after bonding the silane through another functionality to the substrate or other inorganic anions that are attached to hydrophobic group or groups, i.e. long alkyl or aryl chains. The reactive functional groups on the silanes can be but not limited to Si—OR, Si—X or Si—NH—Si (where R is alkyl or aryl group and X is halogen).

Yet another group of silane not directly falling in the above classification but can be used for formation of hydrophobic layer are cyclic azasilanes.

Some examples of non-silane compound are alkyl phosphates or phosphonates. The surface reactive functional groups have to bond to the surface strongly enough to be retained on the surface during and after capping process.

When used as prior to the capping process (i.e. prior the formation of metal or metal alloy cap on Cu structures) both the ILD as well as the embedded Cu structures has to be cleaned. The cleaning should preferably remove copper oxide from the copper structure in order to avoid silane layer formation on Cu structure. Since silane attachment to oxide-free copper is weak (if the silane compound does not contain strongly bonding groups such as amines, thiols etc.) the silane layer formation will be restricted to the dielectric area.

This process creates a hydrophobic layer, so the use of any functional groups going through protonation/deprotonation reaction or hydrogen bonding in water is not recommended. Preferred water insensitive functionalities are alkyl, aryl, or their derivatives where one or more (or ultimately all) hydrogen atoms are exchanged to halogen atoms such as fluorine, chlorine, bromine, iodine with fluorine being the most preferred.

The layer can be formed by exposing the substrate to silane vapors (for the volatile silanes) or solvents, such as but not limited to ethyl alcohol, i-propanol, 1-methyl-2-pyrrolidinone or chloroform, containing the most moisture sensitive silanes or aqueous solution for less hydrolysis sensitive silanes as well as alkylphosphonates and alkylphosphates. The latter compounds, such as the less hydrolysis sensitive silanes as well as alkylphosphonates and alkylphosphates, however, can also be applied in non-aqueous solutions.

In addition the substrate can be exposed directly to the silane compound without using any solvent if needed. The exposure is preferably performed at room temperature but lower or higher temperatures can also be used to control thickness and cross linking of the layer. Table 1 shows the results obtained with silane treatment on different type of dielectrics.

TABLE 1

| | Contact angle (°) | | |
|---|---|---|---|
| Substrate | No process | Full process | Hydrophobic layer/full process |
| $SiO_2$ | 21 | <9 | 96 |
| Black diamond | 39 | 16 | 92 |

The hydrophobic layers formed from the above detailed process also act as barriers against post-process moisture uptake. Such moisture uptake for instance during storage can induce oxidation and corrosion of capping layer, which ultimately leads to higher ILD contamination and consequently higher leakage current, worse voltage breakdown, and reduced TDDB performance. In addition, the barrier performance of the capping layer against diffusion will also be adversely affected by corrosion.

The hydrophobic layer as outlined above can be formed prior to the actual capping layer deposition, right after the capping layer formation (see below) or as a part of post-treatment.

4. Surface modification by including the hydrophobic layer forming component into the deposition solution bath.

Any combination of the above mentioned methods is practical. The application is discussed with Cu interconnect as an example but not limited to Cu interconnect.

Example 1

A patterned wafer is exposed to cleaning solution to remove copper oxide from the surface then rinsed and dried. Subsequently, the wafer is exposed to toluene trimethoxy silane vapor for 300 seconds at room temperature, followed by i-propanol and DI rinse. After these steps, the wafer either undergoes further cleaning step(s) or subjected to electroless deposition followed by post-clean, if needed, then rinse and dry. The surface obtained in this manner retains a strongly hydrophobic character even after the entire deposition process. In most cases, the contact angle of the surface is higher after the full process with silane treatment than the non-processed wafer. In the absence of silane treatment, the contact angle is significantly lower than that of the non-processed wafer. This statement is valid for silicon oxide or other silicon oxide containing dielectric materials such as Black Diamond.

Referring now to FIG. 1, therein is shown a close up view of a semiconductor interconnect 100 after a CMP step according to a first embodiment of the present invention.

A semiconductor wafer 102 may be of a material such as silicon, gallium arsenide, diamond, etc. The semiconductor wafer 102 has been processed to form semiconductor elements, such as transistors, in and above it.

A dielectric layer 104, such as an ILD, has been deposited on the semiconductor wafer 102. The dielectric layer 104 is of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. Ultra-low dielectric constant dielectric materials are dielectric materials having dielectric constants below 2.5. Examples of such materials include commercially available Teflon, Teflon-AF, Teflon microemulsion, polimide nanofoams, silica aerogels, silica xerogels, and mesoporous silica.

The dielectric layer 104 has been processed to have a channel or via formed therein, which is lined with a barrier layer 106. The barrier layer 106 is of materials such as tantalum (Ta), tantalum nitride (TaN), titanium (Ti), tungsten (W), alloys thereof, and compounds thereof.

The barrier layer 106 is filled with a conductor 108 such as copper (Cu), aluminum (Al), gold (Au), silver (Ag), alloys thereof, and compounds thereof.

The semiconductor interconnect 100 has been subject to CMP and the conductor 108 has oxidized to form an oxide layer 110. In one embodiment where the conductor 108 is copper, the oxide layer 110 is copper oxide.

Figure 2:
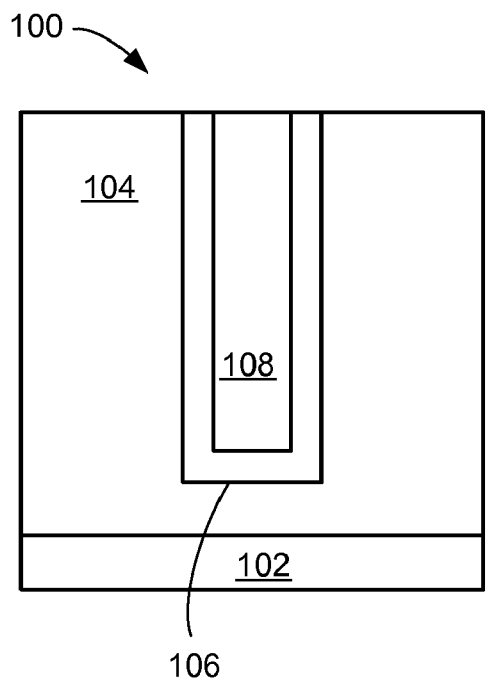
FIG. 2 is a close up view of the semiconductor interconnect after an oxide removal step according to a first embodiment of the present invention.

Referring now to FIG. 2, therein is shown a close up view of the semiconductor interconnect 100 after an oxide removal step according to a first embodiment of the present invention.

The oxide removal step removes the oxide layer 110 of FIG. 1.

Figure 3:
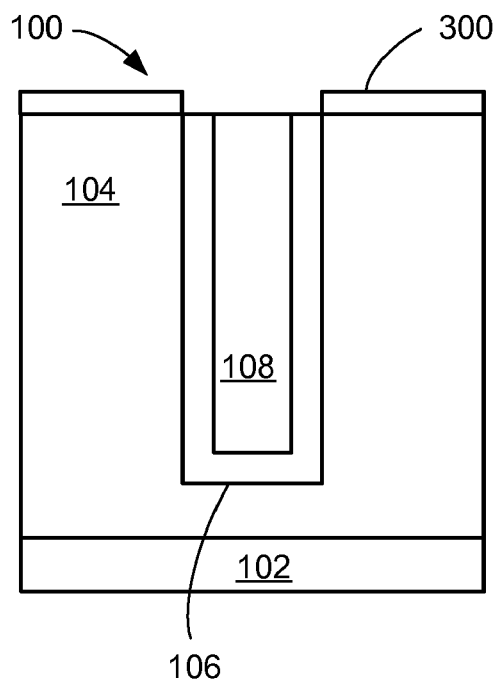
FIG. 3 is a close up view of the semiconductor interconnect after a hydrophobic layer formation step according to a first embodiment of the present invention.

Referring now to FIG. 3, therein is shown a close up view of the semiconductor interconnect 100 after a hydrophobic layer formation step according to a first embodiment of the present invention.

A hydrophobic layer 300 in one embodiment can be a silane layer. Due to the nature of the hydrophobic layer 300, it does not form on the barrier layer 106 or the conductor 108 but has surface reactive functional groups to strongly bond to the dielectric layer 104 to be retained during further processing.

Figure 4:
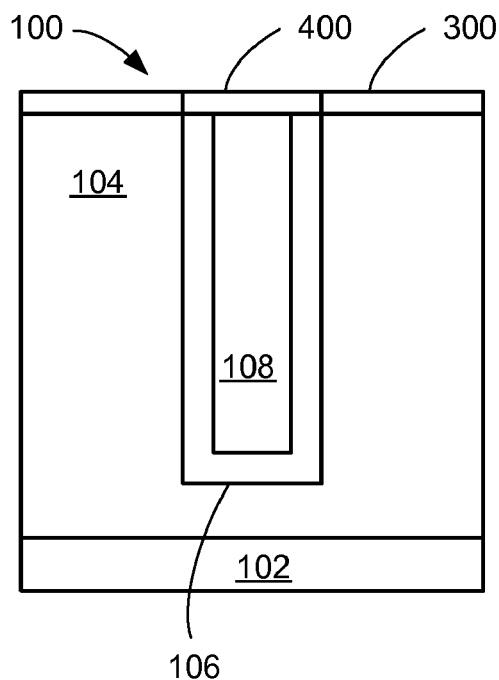
FIG. 4 is a close up view of the semiconductor interconnect after a capping step according to a first embodiment of the present invention.

Referring now to FIG. 4, therein is shown a close up view of the semiconductor interconnect 100 after a capping step according to a first embodiment of the present invention.

A capping layer 400 is then deposited on the barrier layer 106 and the conductor 108. The capping layer 400 can be a metal or metal compound such as cobalt (Co) or cobalt tungsten phosphorous (CoWP), cobalt tungsten boron (CoWB), cobalt tungsten phosphorous boron (CoWPB), etc., deposited by electroless deposition.

Example 2

After depositing the capping layer and rinsing the wafer surface to remove deposition solution the wafer is subjected to scrubbing to remove contaminant from the surface. The scrubbing solution contains a corrosion inhibitor (i.e. a triazole compound such as toluol triazole, benzotriazole) an oxygen scavenger (i.e. L-ascorbic acid), and a complexing agent, which also serve as pH adjustor for the cleaning solution. One such pH adjustor is oxalic acid. The pH of this solution is between 1.5 to 2.0. The concentration of inhibitor is between 0.1 to 10000 ppm, most preferably 100 to 2000 ppm. The oxygen scavenger concentration is between 0 to 10000 ppm, most preferably between 1000 to 5000 ppm. The oxalic acid concentration is between 2 to 50 g/L, most preferably between 5 to 15 g/L.

The steps of the method in accordance with embodiments of the present invention are:
1. Moisture removal by different drying methods after forming metal or metal alloy cap on Cu structures:
   a. thermal treatment between Cu CMP and capping layer deposition:
      i. baking in inert ($N_2$, Ar, etc.) environment or vacuum environment or
      ii. drying with hot inert gas;
   b. critical point drying with supercritical $CO_2$;
   c. drying with de-hydrated agent(s) such as but not limited to dehydrated alcohol; or
   d. drying with water reactive chemicals.
2. Surface contamination removal after forming metal or metal alloy cap on Cu structures:
   a. by plasma (e.g. Ar, $N_2$, $NH_3$, $H_2$ . . . ) surface clean;
   b. supercritical $CO_2$ surface clean;
   c. by removing the metal ions from the dielectric surface through:
      i. complexation (e.g. HEDTA, cyanide) or
      ii. altering the charge of the metal compound on ILD surface as well as the surface charge of the ILD;
   d. dissolving metal in low pH solution;
   e. lift-off contaminants by dissolving ILD;
   f. a combination of the above; or
   g. a combination of any of the above with mechanically enhanced cleaning (e.g. scrub).
3. Surface modification by creating hydrophobic layer(s). Prior (on ILD) or after (ILD, metal cap, or both) the formation of metal or metal alloy cap on Cu structures using multifunctional group silane(s) (where at least one of the functional group is apolar and remain intact during and after the hydrophobic layer formation process, while the other group or groups react with substrate and bonds the silane to the surface) or any hybrid compound that is made of a hydrophobic functionality and at least one inorganic acid group which bonds to the surface strongly enough to be retained on the surface during and after the capping process.
4. Surface modification by including the hydrophobic layer forming component into the deposition solution bath.

Any combination of the above mentioned methods is part of an embodiment of the present invention. The application is discussed with Cu interconnect as an example but not limited to Cu interconnect.

Figure 5:
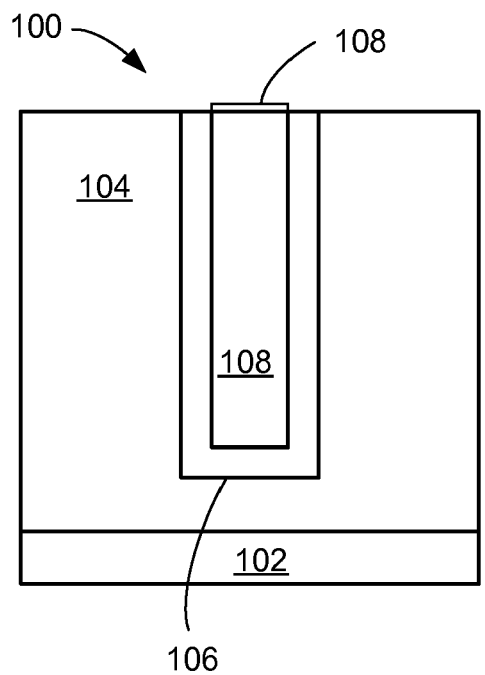
FIG. 5 is a close up view of the semiconductor interconnect after a CMP step according to a second embodiment of the present invention.

Referring now to FIG. 5, therein is shown a close up view of the semiconductor interconnect 100 after a CMP step according to a second embodiment of the present invention. The structure is the same as in FIG. 1.

Figure 6:
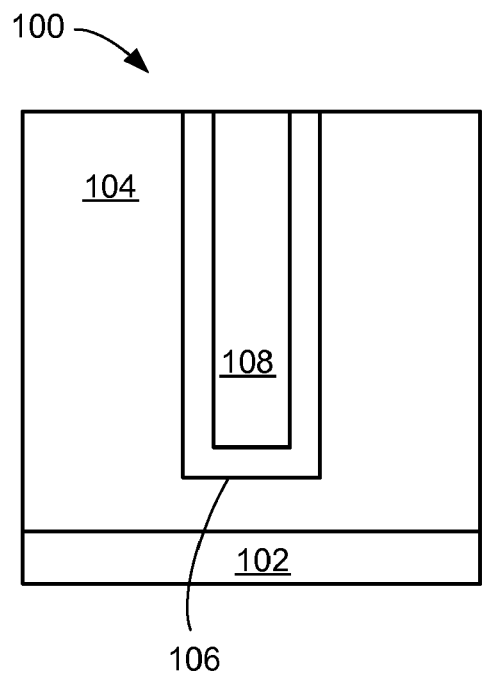
FIG. 6 is a close up view of the semiconductor interconnect after an oxide removal step according to a second embodiment of the present invention.

Referring now to FIG. 6, therein is shown a close up view of the semiconductor interconnect 100 after an oxide removal step according to a second embodiment of the present invention. The structure is the same as FIG. 2.

Figure 7:
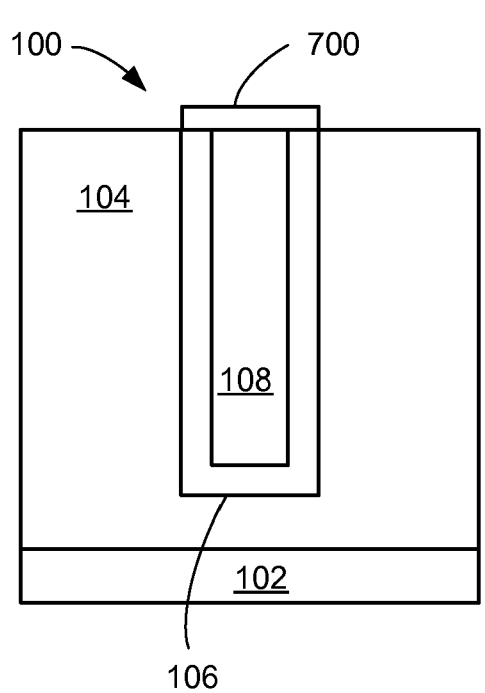
FIG. 7 is a close up view of the semiconductor interconnect after a capping step according to a second embodiment of the present invention.

Referring now to FIG. 7, therein is shown a close up view of the semiconductor interconnect 100 after a capping step according to a second embodiment of the present invention.

A capping layer 700 is then deposited on the barrier layer 106 and the conductor 108. The capping layer 700 can be a metal or metal compound such as cobalt (Co) or cobalt tungsten phosphorous (CoWP) deposited by electroless deposition.

Figure 8:
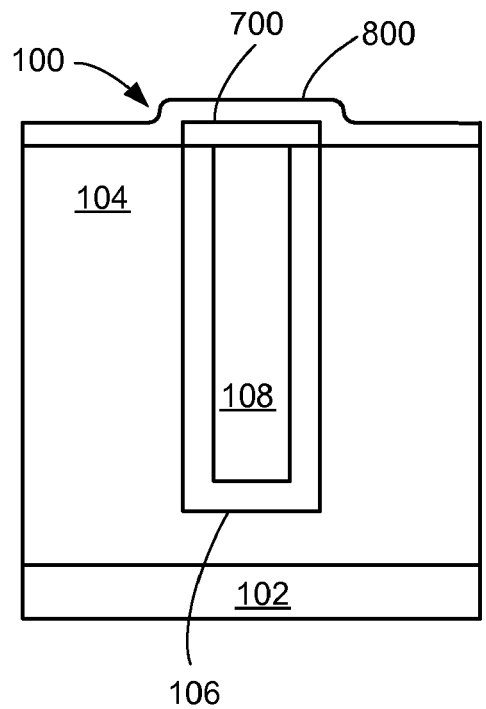
FIG. 8 is a close up view of the semiconductor interconnect after a post deposition treatment step according to a second embodiment of the present invention.

Referring now to FIG. 8, therein is shown a close up view of the semiconductor interconnect 100 after a post deposition treatment step according to a second embodiment of the present invention.

A hydrophobic layer 800 in one embodiment can be a silane layer. The hydrophobic layer 800 forms over the capping layer 700 and has surface reactive functional groups to strongly bond to the dielectric layer 104 to be retained during further processing.

Figure 9:
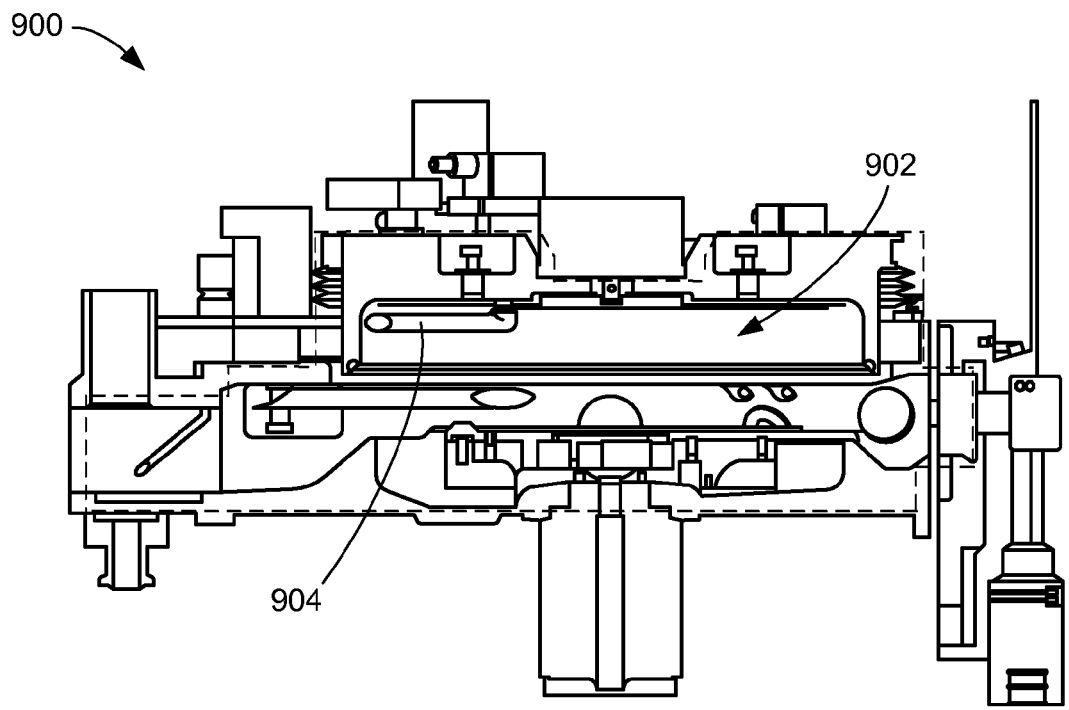
FIG. 9 is shown a semiconductor system used in practicing an embodiment of the present invention.

Referring now to FIG. 9, therein is shown a semiconductor system 900 used in practicing an embodiment of the present invention.

The semiconductor system 900 can perform a multi-step process including as an example: surface preparation, initiation, optional rinse, deposition, and post deposition treatments. The semiconductor system 900 includes a wafer processing chamber and related system 902 and a dispensing and related system 904.

Figure 10:
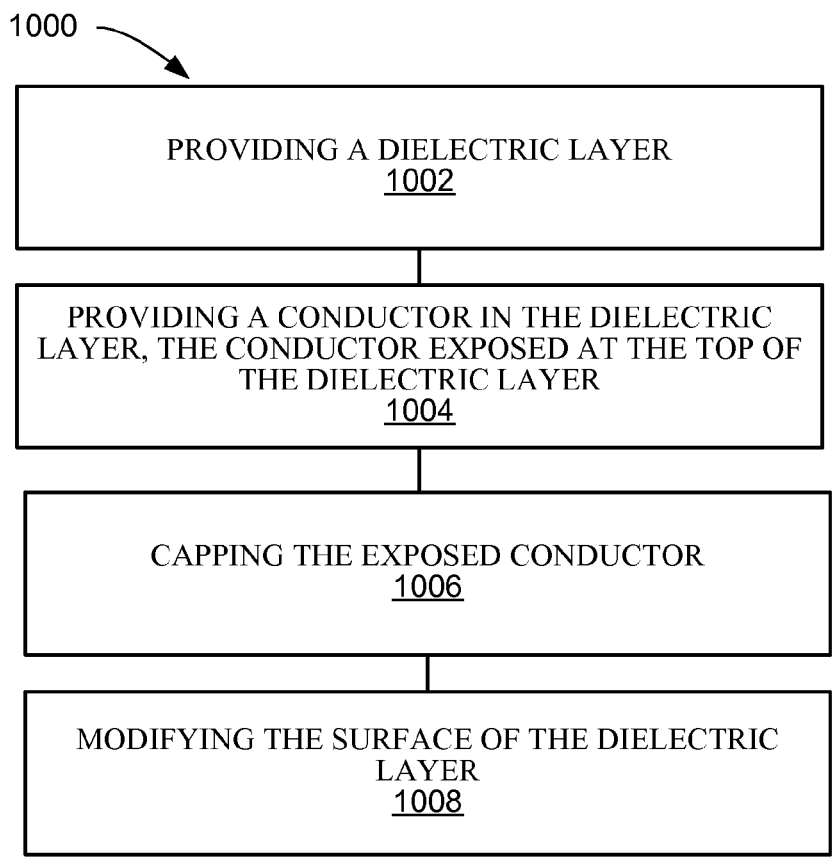
FIG. 10 is a flow chart of a semiconductor system in accordance with another embodiment of the present invention.

Referring now to FIG. 10, therein is shown a flow chart of a semiconductor system 1000 in accordance with another embodiment of the present invention. The semiconductor system includes: providing a dielectric layer in a block 1002; providing a conductor in the dielectric layer, the conductor exposed at the top of the dielectric layer in a block 1004; capping the exposed conductor in a block 1006; and modifying the surface of the dielectric layer, wherein modifying the surface includes cleaning conductor ions from the dielectric layer by dissolving the conductor in a low pH solution, dissolving the dielectric layer under the conductor ions, mechanically enhanced cleaning, or chemisorbing a hydrophobic layer on the dielectric layer in a block 1008.

After further processing of a similar sort to build up additional layers of conductor and dielectric layers, the wafer is singulated into individual semiconductor chips, and packaged into integrated circuit packages.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hither-to-fore set forth herein or shown in the accompanying drawings are to be interpreted in an illustrative and non-limiting sense.

We claim:

1. A method of making an interconnect device, comprising:
   providing a dielectric layer;
   providing a conductor in the dielectric layer, the conductor exposed at the top of the dielectric layer;
   capping the exposed conductor with a metallic cap material;
   cleaning conductor ions from the dielectric layer by dissolving the conductor ions in a low pH solution or dissolving the dielectric layer under the conductor ions; and
   chemisorbing a hydrophobic layer on the dielectric layer prior to capping.

2. The method of claim 1 further comprising thermal treatment by baking in an inert or vacuum environment, or hot inert gas prior to capping.

3. The method of claim 1 further comprising critical point drying with a supercritical gas after capping.

4. The method of claim 1 further comprising drying with a de-hydrated agent, water reactive chemical, or a combination thereof after capping.

5. The method of claim 1 further comprising plasma clean, supercritical gas clean, or a combination thereof after capping.

6. The method of claim 1 wherein cleaning conductor ions from the dielectric layer is achieved by complexation.

7. The method of claim 1 wherein cleaning conductor ions from the dielectric layer includes altering the charge of the conductor and the surface charge of the dielectric layer.

8. A method of making an interconnect device, comprising:
   providing a dielectric layer;
   providing a conductor in the dielectric layer, the conductor exposed at the top of the dielectric layer;
   capping the exposed conductor with a metallic cap material; and
   creating a hydrophobic layer on the dielectric layer, the capping layer, or a combination thereof, the hydrophobic layer being formed during the capping of the exposed conductor by a component in a deposition solution bath.

9. The method of claim 8 further comprising thermal treatment by baking in an inert or vacuum environment, or hot inert gas prior to capping.

10. The method of claim 8 further comprising critical point drying with a supercritical gas after capping.

11. The method of claim 8 further comprising drying with a de-hydrated agent, water reactive chemical, or a combination thereof after capping.

12. The method of claim 8 further comprising plasma clean, supercritical gas clean, or a combination thereof after capping.

13. The method of claim 8 further comprising cleaning conductor ions from the dielectric layer by complexation.

14. The method of claim 8 further comprising cleaning conductor ions from the dielectric layer by altering the charge of the conductor and the surface charge of the dielectric layer.

15. A method of making an interconnect device comprising:
   providing a dielectric layer;
   providing a conductor in the dielectric layer, the conductor exposed at the top of the dielectric layer;
   capping the exposed conductor with a metallic cap material;
   forming a hydrophobic layer immediately after forming the cap material; and
   removing moisture from the surface of the interconnect device.

16. The method of claim 15, wherein the removing moisture includes thermal treatment by baking in an inert or vacuum environment, or hot inert gas before capping at a temperature of about 30° C. to about 150° C.

17. The method of claim 15, wherein the removing moisture includes critical point drying with carbon dioxide after capping.

18. The method of claim 15, wherein the removing moisture includes drying with a de-hydrated alcohol, water reactive di-tert-butyl dicarbonate or acetic anhydride, or a combination thereof after capping.

19. The method of claim 15, further comprising non-reactive gas plasma clean, supercritical carbon dioxide clean, or a combination thereof after capping.

20. The method of claim 15, further comprising cleaning conductor ions from the dielectric layer by complexation using HEDTA.

21. The method of claim 15, further comprising cleaning conductor ions from the dielectric layer by altering the charge of the conductor and the surface charge of the dielectric layer using a pH solution lower than about 2.

22. The method of claim 15, further comprising cleaning conductor ions from the dielectric layer by dissolving the conductor in a pH solution lower than 2, lifting off contaminants by dissolving the dielectric layer under the conductor ions, mechanical scrub cleaning, or a combination thereof.

23. The method of claim 15, wherein forming a hydrophobic layer includes chemisorbing a non-amine or non-thiol silane hydrophobic layer on the dielectric layer.

24. The method of claim 15, wherein forming a hydrophobic layer includes creating a silane, cyclic azasilane, or phosphonate hydrophobic layer on the dielectric layer, the capping layer, or a combination thereof.

25. The method of claim 15, wherein forming a hydrophobic layer includes creating a hydrophobic layer by exposure to silane vapors or solvents including ethyl alcohol, i-propanol, 1-methyl-2-pyrrolidinone or chloroform, alkylphosphonates, or alkylphosphates on the dielectric layer, the capping layer, or a combination thereof.

26. The method of claim 15, further comprising wet cleaning the wafer using corrosion inhibitor or oxygen scavenger in an atmosphere where the oxygen is less than 20% by volume.

27. The method of claim 1, wherein the low pH is approximately less than 2.

28. The method of claim 1, wherein the metallic cap material includes cobalt.

29. The method of claim 8, wherein the metallic cap material includes cobalt.

30. The method of claim 15, wherein the metallic cap material includes cobalt.

* * * * *